United States Patent
LaFrieda et al.

(10) Patent No.: US 11,714,607 B2
(45) Date of Patent: Aug. 1, 2023

(54) ADDER CIRCUIT USING LOOKUP TABLES

(71) Applicant: Achronix Semiconductor Corporation, Santa Clara, CA (US)

(72) Inventors: Christopher LaFrieda, Ridgefield, NJ (US); Virantha Ekanayake, Baltimore, MD (US)

(73) Assignee: Achronix Semiconductor Corporation, Santa Clara, CA (US)

( * ) Notice: Subject to any disclaimer, the term of this patent is extended or adjusted under 35 U.S.C. 154(b) by 288 days.

(21) Appl. No.: 17/134,838

(22) Filed: Dec. 28, 2020

(65) Prior Publication Data

US 2022/0206758 A1    Jun. 30, 2022

(51) Int. Cl.
| | | |
|---|---|---|
| *G06F 7/575* | (2006.01) | |
| *G06F 7/504* | (2006.01) | |
| *G06F 1/03* | (2006.01) | |
| *H03K 19/20* | (2006.01) | |
| *H03K 19/21* | (2006.01) | |

(52) U.S. Cl.
CPC ............... *G06F 7/575* (2013.01); *G06F 1/03* (2013.01); *G06F 7/5045* (2013.01); *H03K 19/20* (2013.01); *H03K 19/21* (2013.01)

(58) Field of Classification Search
CPC ...... G06F 7/50–508; G06F 7/57; G06F 7/575; G06F 1/03; H03K 19/173; H03K 19/1731; H03K 19/1733–1737; H03K 19/20; H03K 19/21
See application file for complete search history.

(56) References Cited

U.S. PATENT DOCUMENTS

| | | | |
|---|---|---|---|
| 5,349,250 A  * | 9/1994 | New | H03K 19/1737 |
| | | | 365/189.08 |
| 6,476,634 B1 | 11/2002 | Bilski | |
| 7,015,921 B1 | 3/2006 | Trivedi et al. | |
| 7,685,215 B1 * | 3/2010 | Gaide | G06F 7/508 |
| | | | 708/700 |

(Continued)

OTHER PUBLICATIONS

P. Kallstrom et al., Fast and Area Eficient Adder for Wide Data in Recent Xilinx FPGAs, 2016 26th International Conference on field Programmable Logic and Applications (FPL), IEEE, 2016 (Year: 2016).*

(Continued)

*Primary Examiner* — Emily E Larocque
(74) *Attorney, Agent, or Firm* — Schwegman Lundberg & Woessner, P.A.

(57) ABSTRACT

A four-input lookup table ("LUT4") is modified to operate in a first mode as an ordinary LUT4 and in a second mode as a 1-bit adder providing a sum output and a carry output. A six-input lookup table ("LUT6") is modified to operate in a first mode as an ordinary LUT6 with a single output and in a second mode as a 2-bit adder providing a sum output and a carry output. Both possible results for the two different possible carry inputs can be determined and selected between when the carry input is available, implementing a 2-bit carry-select adder when in the second mode and retaining the ability to operate as an ordinary LUT6 in the first mode. Using the novel LUT6 design in a circuit chip fabric allows a 2-bit adder slice to be built that efficiently makes use of the LUT6 without requiring additional logic blocks.

20 Claims, 12 Drawing Sheets

(56) References Cited

U.S. PATENT DOCUMENTS

2008/0068041 A1* 3/2008 Madurawe ............. H01H 9/563
326/38
2020/0106442 A1* 4/2020 Langhammer .......... G06F 7/523

OTHER PUBLICATIONS

D. Lewis et al., The Stratix II logic and routing architecture, FPGA '05: Proceedings of the 2005 ACM/SIGDA 13th international symposium on Field-programmable gate arrays, 2005 (Year: 2005).*

"International Application Serial No. PCT US2021 058656, International Search Report dated Feb. 7, 2022", 2 pgs.

"International Application Serial No. PCT US2021 058656, Written Opinion dated Feb. 7, 2022", 4 pgs.

* cited by examiner

ADDER CIRCUIT USING LOOKUP TABLES

BACKGROUND

Field-programmable gate arrays (FPGAs) are integrated circuits customized after manufacture. An FPGA comprises an array of logic blocks comprising elements such as lookup tables (LUTs), adders, and flip-flops.

An adder circuit performs addition of numbers. An adder of size N adds two N-bit numbers, generating an N-bit output and a carry bit. The carry bit is set to 1 if the sum overflowed the N-bit output and to 0 if the N-bit output is accurate.

The output of a 1-bit adder is the exclusive or (XOR) of the two 1-bit inputs along with a carry output that is the AND of the two 1-bit inputs. For example, if the two 1-bit inputs are A and B, the result is S, and the carry output is C:

$$S = A \oplus B$$
$$C = AB$$

To create a 2-bit adder using 1-bit adders, the higher-order portion of the adder also handles a carry input. The final sum and carry output of the higher-order portion depends on the terms discussed above and on the carry input.

$$S = A \oplus B \oplus Cin$$
$$Cout = AB + (A + B)Cin$$

The 1-bit adders may be further chained to generate an adder of any size, with each adder dependent on the carry output of the next lower-order adder. Since the adders are resolved sequentially, the time delay to generate a result of an N-bit adder constructed in this way is N times the time delay of a 1-bit adder.

A carry-select adder (CSA) computes both possible outputs before the carry input is known and selects between them when the carry input becomes available using a multiplexer. This design increases circuit complexity, but substantially reduces the delays resulting from increasing the size of the adder.

BRIEF DESCRIPTION OF THE DRAWINGS

Some embodiments of the disclosed technology are illustrated by way of example and not limitation in the figures of the accompanying drawings.

DETAILED DESCRIPTION

Figure 1:
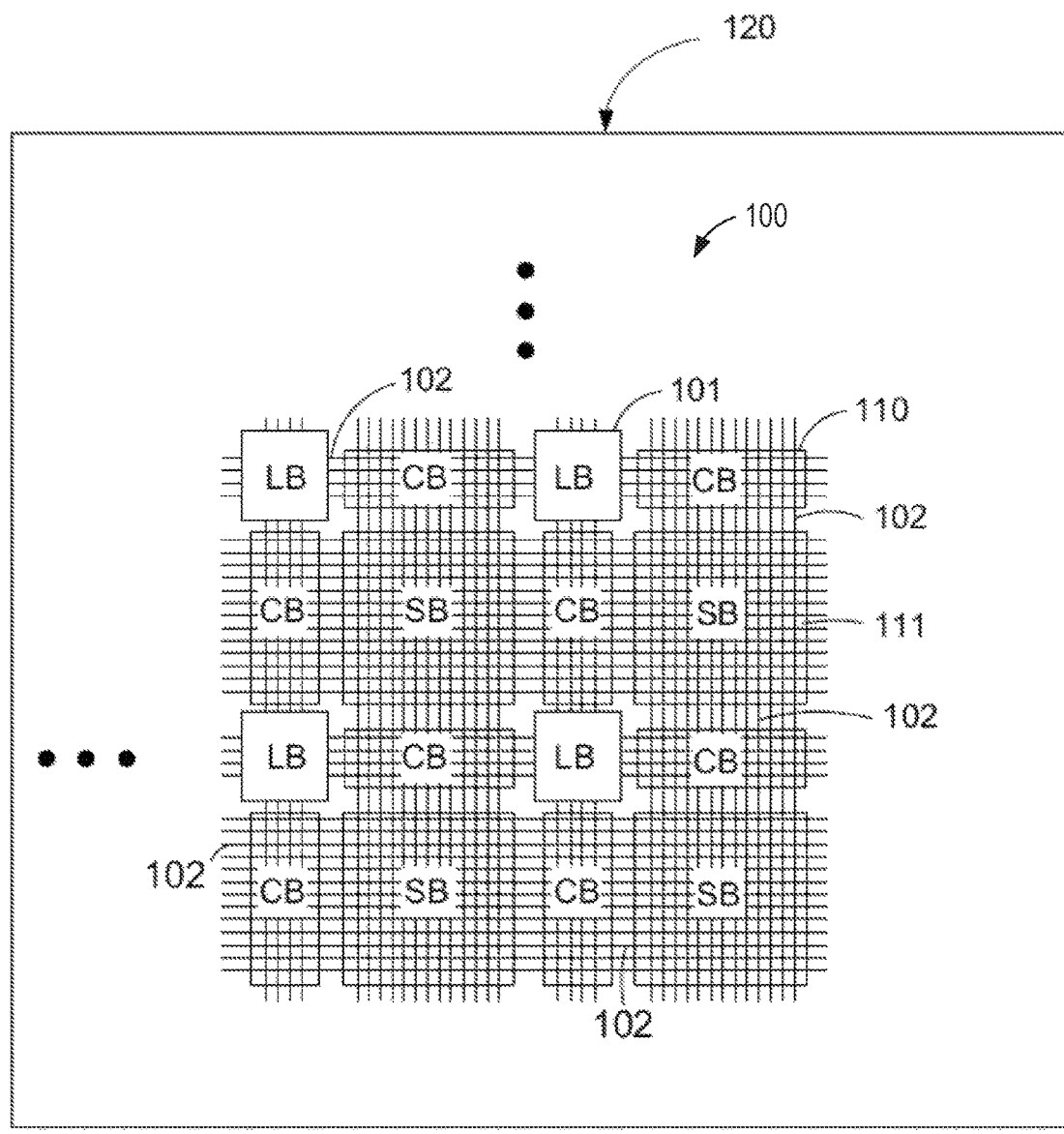
FIG. 1 is a diagrammatic view of an example circuit chip fabric, according to various embodiments of the invention.

Example methods, systems, and circuits for FPGA adders using LUTs will now be described. In the following description, numerous examples having example-specific details are set forth to provide an understanding of examples. It will be evident, however, to one of ordinary skill in the art that these examples may be practiced without these example-specific details, and/or with different combinations of the details than are given here. Thus, specific examples are given for the purpose of simplified explanation, and not limitation.

LUTs can be viewed in a hierarchical manner. For example, a hypothetical 1-input LUT can be implemented as a multiplexer that selects between two set values based on the 1-bit input; a 2-input LUT (LUT2) can be implemented as two 1-input LUTs both selecting a value based on a first input, followed by a multiplexer that selects between those two values based on the second input; a 3-input LUT can be implemented as two LUT2s using the first two inputs, followed by a multiplexer that selects between the output of the two LUT2s based on the third input; and so on.

As discussed herein, a 1-bit adder can be implemented as two LUT3s. Each LUT3 takes as input the two bits to be added and the carry bit from the next-lower adder (set to 0 for the lowest-order adder). One LUT3 generates the sum output and the other LUT3 generates the carry output. Thus, in some examples, a LUT4 (comprising two LUT3s and a multiplexer) is modified to operate in a first mode as an ordinary LUT4 with a single output and in a second mode as a 1-bit adder providing a sum output and a carry output.

By adding two additional multiplexers to the LUT4, as described in some examples, both possible results for the two different possible carry inputs can be determined and selected between when the carry input is available, implementing a 1-bit CSA when in the second mode and retaining the ability to operate as an ordinary LUT4 in the first mode.

Two LUT5s may be used to implement a 2-bit adder. Each LUT5 takes as input the two two-bit inputs to be added and the carry bit from the next lower adder. One LUT5 generates the sum output and the other LUT5 generates the carry output. Thus, in some examples, a LUT6 (comprising two LUT5s and a multiplexer) is modified to operate in a first mode as an ordinary LUT6 with a single output and in a second mode as a 2-bit adder providing a sum output and a carry output.

With modifications as discussed herein, both possible results for the two different possible carry inputs can be determined and selected between when the carry input is available, implementing a 2-bit CSA when in the second mode and retaining the ability to operate as an ordinary LUT6 in the first mode. In some examples, intermediate outputs are taken at the level of four LUT4s instead of two LUT5s for processing to generate the 2-bit result and carry output. Accordingly, in the first mode, the standard output is used and in the second mode, the four LUT4 outputs are used. The mode is selected at the time of place and route of the FPGA.

Using the novel LUT6 design in a circuit chip fabric allows a 2-bit adder slice to be built that efficiently makes use of the LUT6 without requiring additional logic blocks. This efficient packing of 2-bit adder slices provides a density advantage, allowing more adders to be built on a single chip. Additionally, since the novel LUT6 design can be configured as a traditional LUT6, existing place and route methodologies can be used to program FPGAs using the novel LUT6 in the traditional mode.

Support for arbitrary numbers of arbitrarily sized adders may be particularly useful in implementation of neural networks, which perform large numbers of additions in each layer. Since FPGAs are less expensive than processors and, using the methods described herein, a single FPGA can simultaneously perform many addition operations, use of the designs described herein may improve the rate at which neural networks can be trained, reduce the power costs associated with neural networks, or both.

As used herein, the term adder slice refers to a circuit that operates as an adder for a subset of the bits being added. For example, an 8-bit adder that adds two 8-bit numbers may be implemented using eight 1-bit adder slices, four 2-bit adder slices, or two 4-bit adder slices. An adder block refers to a circuit made of one or more adder slices.

FIG. 1 is a diagrammatic view of an example circuit chip fabric 100, according to various examples of the invention. The fabric 100 contains programmable arrays of logic blocks 101 that support a variety of programmable logic functions. Routing tracks 102 in the fabric 100, illustrated as a plurality of orthogonally oriented tracks, are used to carry electronic signals and implement reconfigurable interconnections between the logic blocks 101. The major elements of a flexible routing architecture used to interconnect the routing tracks and configure the logic blocks include connection boxes 110 and switch boxes 111.

In implementation, the switch boxes 111 can be switches that connect wires to wires (e.g., the wires in the horizontal and vertical routing tracks: wires in horizontal tracks to wires in horizontal tracks, wires in vertical tracks to wires in vertical tracks, and wires in horizontal tracks to wires in vertical tracks). The connection boxes 110 can be switches that connect wires in horizontal and/or vertical tracks to the logic block 101 elements. For purposes of illustration, only exemplary elements in the drawing figure have been marked. However, a person of ordinary skill in the art will understand that the routing tracks 102, the connection boxes 110, and the switch boxes 111 can, in practice, be replicated over the surface of a semiconductor chip in order to provide the desired interconnection functionality.

The structure of the connection boxes 110 and the switch boxes 111 determine the connections of the routing tracks 102 to the logic blocks 101, thereby determining the functionality of a semiconductor chip 120 that includes them. For example, a semiconductor chip 120 that includes the fabric 100 may be fabricated as an FPGA, such as the type available from Achronix™, Xilinx™, Altera™ and other vendors.

In some examples, each logic block includes LUTs, an arithmetic chain, and optional registers. Through the use of the novel LUT configurations described herein, the number of LUTs used to implement multiplication may be reduced. As a result, less area is used by logic blocks implementing a multiplication function. As a further result, since less area is used, the propagation time between the involved logic blocks is reduced, which reduces the time taken to complete a multiplication. Additionally, the use of fewer logic blocks per multiplier consumes less power, allows more multipliers to be placed on a single FPGA chip, or both.

Figure 2:
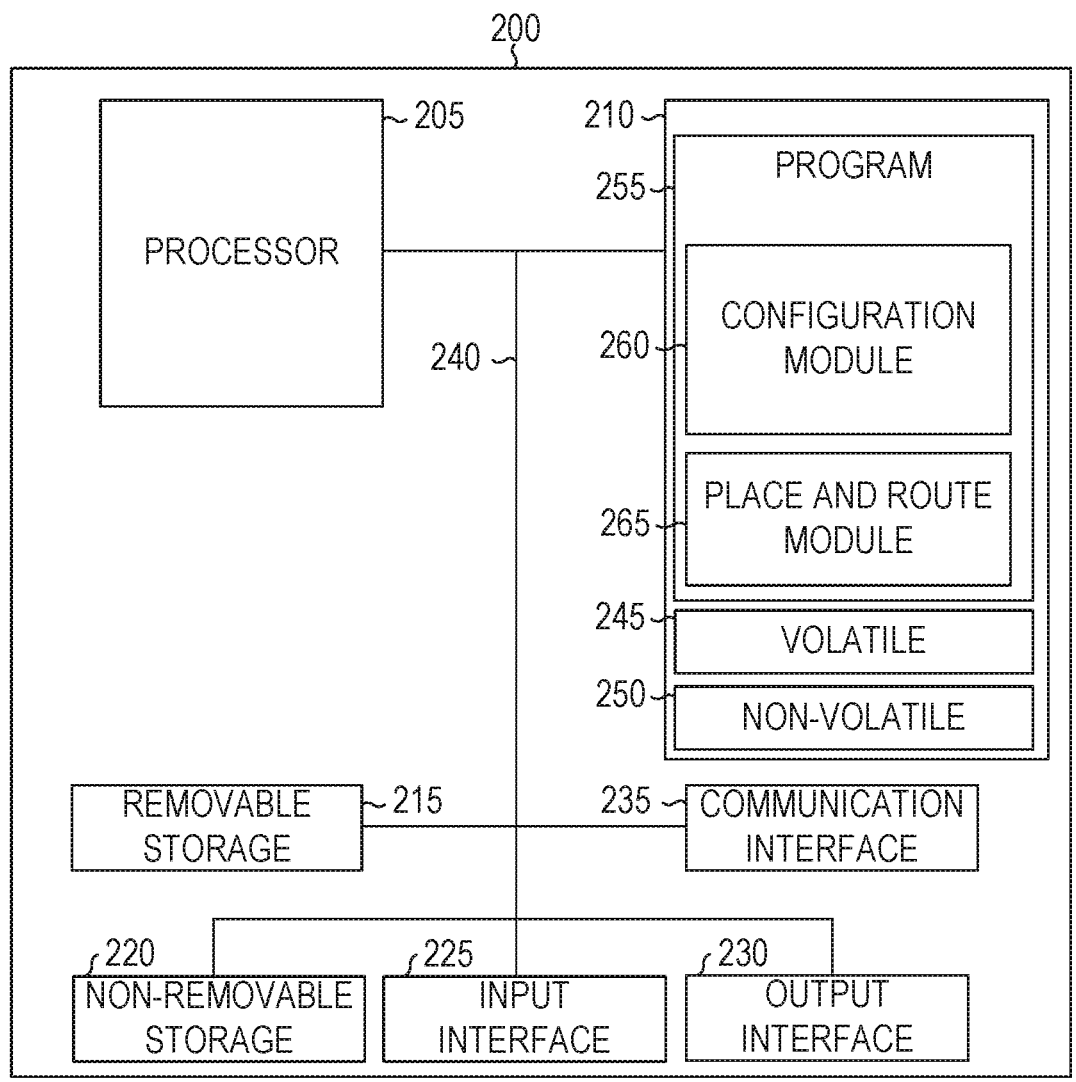
FIG. 2 is a block diagram illustrating components of a system that programs an FPGA, according to various embodiments of the invention.

FIG. 2 is a block diagram illustrating components of a computer 200 that programs an FPGA, according to some examples. All components need not be used in various embodiments. For example, clients, servers, autonomous systems, and cloud-based network resources may each use a different set of components, or, in the case of servers for example, larger storage devices.

One example computing device in the form of a computer 200 (also referred to as computing device 200 and computer system 200) may include a processor 205, memory storage 210, removable storage 215, and non-removable storage 220, all connected by a bus 240. Although the example computing device is illustrated and described as the computer 200, the computing device may be in different forms in different embodiments. For example, the computing device may instead be a smartphone, a tablet, a smartwatch, or another computing device including elements the same as or similar to those illustrated and described with regard to FIG. 2. Devices such as smartphones, tablets, and smartwatches are collectively referred to as "mobile devices." Further, although the various data storage elements are illustrated as part of the computer 200, the storage may also or alternatively include cloud-based storage accessible via a network, such as the Internet, or server-based storage.

The memory storage 210 may include volatile memory 245 and non-volatile memory 250, and may store a program 255. The computer 200 may include, or have access to, a computing environment that includes, a variety of computer-readable media, such as the volatile memory 245; the non-volatile memory 250; the removable storage 215; and the non-removable storage 220. Computer storage includes random-access memory (RAM), read-only memory (ROM), erasable programmable read-only memory (EPROM) and electrically erasable programmable read-only memory (EEPROM), flash memory or other memory technologies, compact disc read-only memory (CD ROM), digital versatile disks (DVD) or other optical disk storage, magnetic cassettes, magnetic tape, magnetic disk storage or other magnetic storage devices, or any other medium capable of storing computer-readable instructions.

The computer 200 may include or have access to a computing environment that includes an input interface 225, an output interface 230, and a communication interface 235. The output interface 230 may interface to or include a display device, such as a touchscreen, that also may serve as an input device. The input interface 225 may interface to or include one or more of a touchscreen, a touchpad, a mouse, a keyboard, a camera, one or more device-specific buttons, one or more sensors integrated within or coupled via wired or wireless data connections to the computer 200, and other input devices. The computer 200 may operate in a networked environment using the communication interface 235 to connect to one or more remote computers, such as database servers. The remote computer may include a personal computer (PC), server, router, network PC, peer device or other common network node, or the like. The communication interface 235 may connect to a local-area network (LAN), a wide-area network (WAN), a cellular network, a WiFi network, a Bluetooth network, or other networks.

Computer instructions stored on a computer-readable medium (e.g., the program 255 stored in the memory storage 210) are executable by the processor 205 of the computer 200. A hard drive, CD-ROM, and RAM are some examples of articles including a non-transitory computer-readable medium such as a storage device. The terms "computer-readable medium" and "storage device" do not include carrier waves to the extent that carrier waves are deemed too transitory. "Computer-readable non-transitory media" includes all types of computer-readable media, including magnetic storage media, optical storage media, flash media, and solid-state storage media. It should be understood that software can be installed in and sold with a computer. Alternatively, the software can be obtained and loaded into the computer, including obtaining the software through a physical medium or distribution system, including, for example, from a server owned by the software creator or from a server not owned but used by the software creator. The software can be stored on a server for distribution over the Internet, for example.

The program 255 is shown as including a configuration module 260 and a place and route module 265. Any one or more of the modules described herein may be implemented using hardware (e.g., a processor of a machine, an application-specific integrated circuit (ASIC), an FPGA, or any suitable combination thereof). Moreover, any two or more of these modules may be combined into a single module, and the functions described herein for a single module may be subdivided among multiple modules. Furthermore, according to various examples, modules described herein as being implemented within a single machine, database, or device may be distributed across multiple machines, databases, or devices.

The configuration module 260 provides a user interface to allow a user to provide a configuration for an FPGA. For example, the user interface may allow the user to identify a hardware design language (HDL) file that specifies the configuration.

The place and route module 265 programs the FPGA based on the configuration. For example, the connection boxes 110, the switch boxes 111, and the routing tracks 102 may be configured. As another example, the connections to and from LUTs, as well as their contents (i.e., the particular output generated for each combination of inputs), may be configured.

Figure 3:
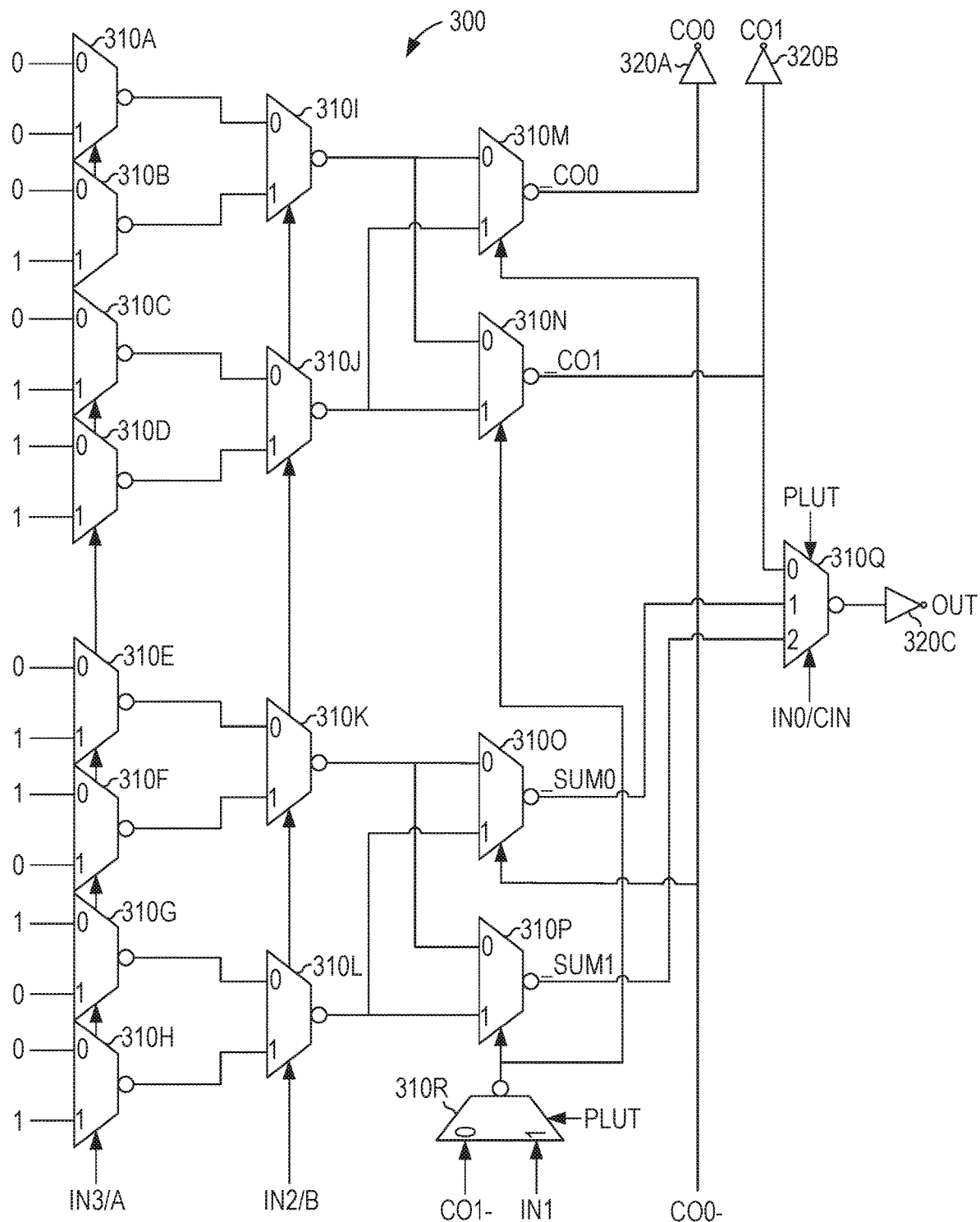
FIG. 3 is a diagrammatic view of a circuit that can operate as a 4-input LUT or as a 1-bit adder, according to various embodiments of the invention.

FIG. 3 is a diagrammatic view of a circuit 300 that can operate as a 4-input LUT or as a 1-bit adder, according to various embodiments of the invention. The circuit 300 comprises multiplexers 310A, 310B, 310C, 310D, 310E, 310F, 310G, 310H, 310I, 310J, 310K, 310L, 310M, 310N, 310O, 310P, 310Q, and 310R and NOT gates 320A, 320B, and 320C. The PLUT input to the multiplexers 310R and 310Q controls whether the circuit 300 operates as a LUT4 or as a 1-bit adder. The three-input multiplexer 310Q selects between inputs 0 and 2 (outputs of multiplexers 310N and 310P) in the LUT4 mode and between inputs 1 and 2 (outputs of multiplexers 310 and 310P) in the 1-bit adder mode. By contrast with a standard LUT4, the circuit 300 adds the PLUT control signal, the multiplexers 310M, 310O, and 310R, and the additional output NOT gates 320A and 320B. Additionally, the multiplexer 310Q is expanded to a 3-input multiplexer from the 2-input multiplexer that would be used in a standard LUT4.

When operating as a 4-input LUT, the data inputs to the multiplexers 310A-310H are defined based on the particular function implemented by the LUT4. The four control inputs to the LUT4 are denoted IN0, IN1, IN2, and IN3. Each of the eight multiplexers 310A-310H takes two data inputs, for a total of 16 data inputs. The 16 data inputs correspond to the 16 possible combinations of the four control inputs, so that each different combination of the four control inputs provides a different one of the 16 data inputs as the output of the NOT gate 320C.

The control input to the multiplexers 310A-310H is IN3. The output of the first layer of multiplexers 310A-310H is provided as data inputs (as shown) to the multiplexers 310I-310L. The control input to the multiplexers 310I-310L is IN2. In the LUT4 mode, the PLUT signal causes the multiplexer 310R to select the IN1 signal and provide that signal as the control signal to the multiplexers 310N and 310P. The IN0 signal is the control signal to the multiplexer 310Q and thus the output of the LUT4 (from the NOT gate 320C) is the output selected based on all four of IN0-IN3.

Note that in the LUT4 mode, the CO0− signal is used as the control signal for the multiplexers 310M and 310O. The output of the multiplexer 310M drives the NOT gate 320A, which is ignored in the LUT4 mode. The output of the multiplexer 310O is provided as an input to the multiplexer 310Q. However, because the PLUT signal indicates that the circuit 300 is operating in the LUT4 mode, the output of the multiplexer 310O is never selected. Thus, these components of the circuit 300, even if present, do not affect the correct operation of the circuit 300 as a LUT4.

When operating as a 1-bit adder, the contents of the lookup table (the data inputs to the multiplexers 310A-310H) are selected as shown to generate the sum result using multiplexers 310E-310H and to generate the carry result using multiplexers 310A-310D.

The control signal to the multiplexers 310A-310H is one of the two one-bit operands, denoted A. The control signal to the multiplexers 310I-310L is the other of the two one-bit operands, denoted B. Based on the PLUT signal, the multiplexer 310R selects CO1− as the control signal for the multiplexers 310N and 310P. CO0− is provided as the control signal for the multiplexers 310M and 310O.

CO0− and CO1− are signals received from a previous adder slice. CO0− is set to zero for the lowest-order adder slice. CO1− is set to one for the lowest-order adder slice. The signals represent what the carry output of the previous adder slice would be if the carry input to the adder block were 0 (CO0−) or 1 (CO1−) (e.g., values generated by assuming that the carry input will be 0 or 1 before the carry input is received). The multiplexer 310Q selects between the two possible results generated (one for each possible carry input) based on the actual carry input, CIN. The CO0 and CO1 outputs of the NOT gates 320A-320B indicate the carry output of the 1-bit adder slice for each of the two possible values of CIN, allowing the next adder slice (e.g., another instance of the circuit 300) to evaluate those possible results before the actual CIN signal is available.

The table below shows the outputs of the circuit 300 for every possible combination of A, B, CO0−, and CO1−. The sum output value is shown as two possible values, selected based on CIN.

| A | B | CO0- | CO1- | OUT | CO0 | CO1 |
|---|---|------|------|-----|-----|-----|
| 0 | 0 | 0 | 0 | 0/0 | 0 | 0 |
| 0 | 0 | 0 | 1 | 0/1 | 0 | 0 |
| 0 | 0 | 1 | 0 | 1/0 | 0 | 0 |
| 0 | 0 | 1 | 1 | 1/1 | 0 | 0 |
| 0 | 1 | 0 | 0 | 1/1 | 0 | 0 |
| 0 | 1 | 0 | 1 | 1/0 | 0 | 1 |
| 0 | 1 | 1 | 0 | 0/1 | 1 | 0 |
| 0 | 1 | 1 | 1 | 0/0 | 1 | 1 |
| 0 | 0 | 0 | 0 | 1/1 | 0 | 0 |
| 1 | 0 | 0 | 1 | 1/0 | 0 | 1 |
| 1 | 0 | 1 | 0 | 0/1 | 1 | 0 |
| 1 | 0 | 1 | 1 | 0/0 | 1 | 1 |
| 1 | 1 | 0 | 0 | 0/0 | 1 | 1 |
| 1 | 1 | 0 | 1 | 0/1 | 1 | 1 |
| 0 | 1 | 1 | 0 | 1/0 | 1 | 1 |
| 1 | 1 | 1 | 1 | 1/1 | 1 | 1 |

Though adders are discussed throughout, other arithmetic functions may be implemented using the circuits described herein. For example, in two's-complement representation, subtracting one number from another number is the same as converting the first number to its two's complement and then adding the two numbers. For all of the LUT-based circuits described herein, the circuits may be configured to perform this transformation by adjusting the LUT to generate an output that corresponds to the adder output if one input were inverted. Additionally, the CIN signal of the lowest-order block is set to 1 instead of 0.

An FPGA that replaces some or all LUT4 blocks with the circuit 300 gains flexibility to implement adders more efficiently than prior art FPGAs that use dedicated LUT4 blocks and dedicated adder circuitry. Additionally, since the circuit 300 is fully operational as a LUT4, no modifications by a programmer of the FPGA are needed to make use of the circuit 300 as a LUT4 if the adder mode is not being used.

Figure 4:
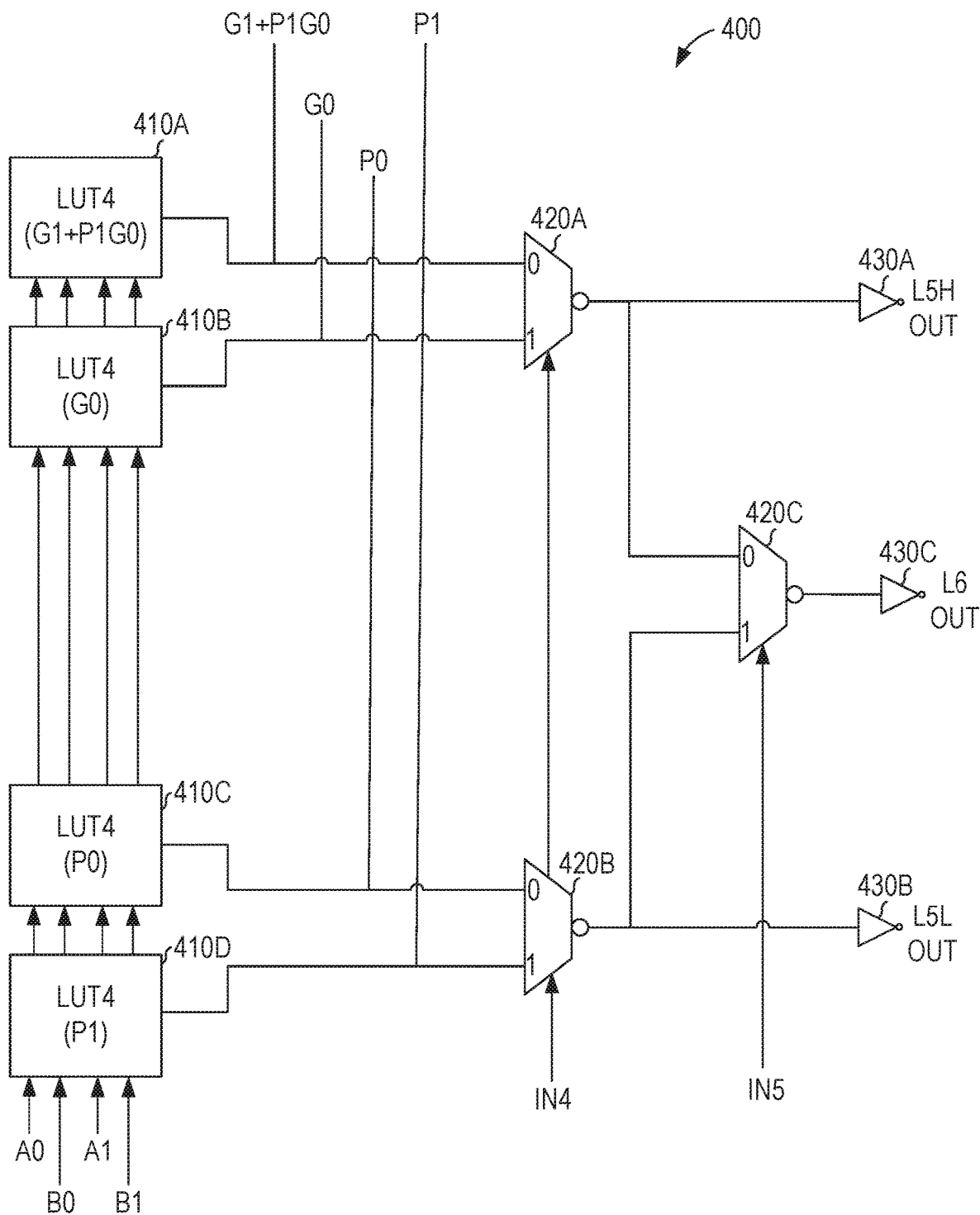
FIG. 4 is a diagrammatic view of a circuit that can operate as a 6-input LUT or as part of a 2-bit adder, according to various embodiments of the invention.

FIG. 4 is a diagrammatic view of a circuit 400 that can operate as a 6-input LUT or as part of a 2-bit adder, according to various embodiments of the invention. The circuit 400 comprises LUT4s 410A, 410B, 410C, and 410D; multiplexers 420A, 420B, and 420C; and NOT gates 430A, 430B, and 430C.

When operating as a LUT6, four input values are provided to the four LUT4s 410A-410D. The remaining two input values are used as control signals to the multiplexers 420A-420C as shown, selecting the output of one of the four LUT4s 410A-410D. The output of the LUT6 is provided at NOT gate 430C.

In some examples, the circuit 400 is configured to operate as two LUT5s, with the sixth input ignored and the two outputs provided at NOT gates 430A and 430B.

When operating as part of a 2-bit adder, the LUT4s 410A-410D are configured to implement four different functions, controlled by the two 2-bit operands. As shown in FIG. 4, two bits of A, A0 and A1, and two bits of B, B0 and B1, are used as the control signals for the four LUT4s 410A-410D.

The LUT4 410B implements the function G0. The addition of two 1-bit numbers "generates" if it will always carry, regardless of the input carry value. G0 indicates whether the addition of A0 and B0 generates. This is true only if both A0 and B0 are 1. Thus, G0=A0B0.

The LUT4 410C implements the function P0. The addition of two 1-bit numbers "propagates" if it will carry when the input carry value is 1 but not if the input carry value is 0. P0 indicates whether the addition of A0 and B0 propagates. This is true if either A0 or B0 is 1, but not when both are 1 or 0. Thus, P0=A0⊕B0.

The LUT4 410D implements the function P1. P1 indicates whether the addition of A1 and B1 propagates. Thus, P1=A1⊕B1.

The LUT4 410A implements the function G1+P1G0. P1 and G0 are defined above. G1=A1B1. Thus, the LUT4 410A implements the function A1B1+(A1⊕B1)A0B0.

Figure 5:
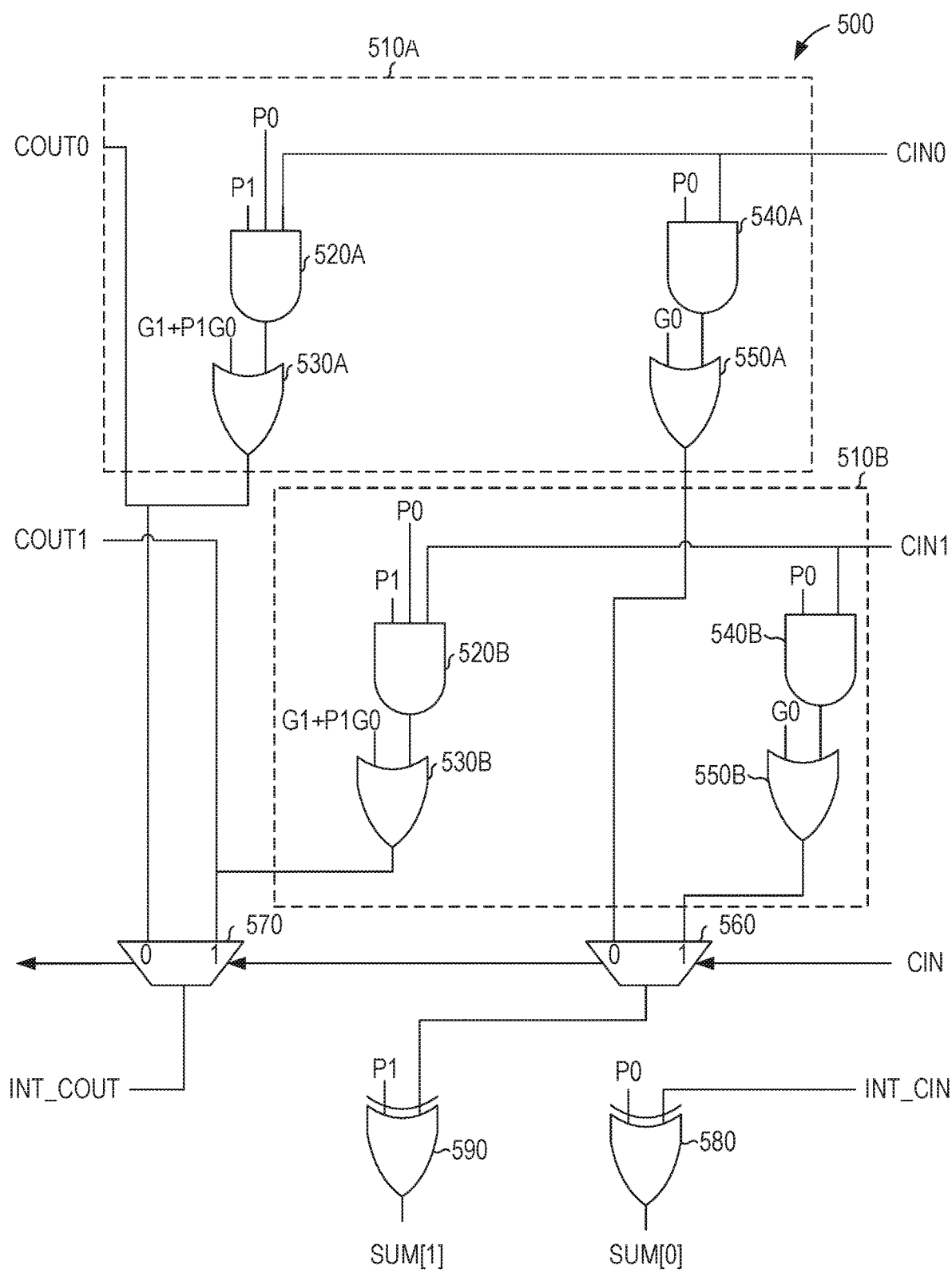
FIG. 5 is a diagrammatic view of a circuit that, in combination with the circuit of FIG. 4, operates as a 2-bit adder, according to various embodiments of the invention.

FIG. 5 is a diagrammatic view of a circuit 500 that, in combination with the circuit 400 of FIG. 4, operates as a 2-bit adder, according to various embodiments of the invention. The circuit 500 comprises a carry-in-zero (CIN0) portion 510A, a carry-in-one (CIN1) portion 510B, and an output portion that selects the output values based on the actual CIN value. The CIN0 portion 510A includes AND gates 520A and 540A and OR gates 530A and 550A. The CIN1 portion 510B includes AND gates 520B and 540B and OR gates 530B and 550B. An output portion of the circuit 500 comprises a multiplexer 560, a multiplexer 570, an XOR gate 580, and an XOR gate 590.

The inputs to the circuit 500 are the four outputs from the LUT4s of the circuit 400 (P0, P1, G0, and G1+P1G0), the two carry-in values CIN0 and CIN1 from the previous slice, the carry-in value for the adder block CIN, and the carry-in value from the previous slice, INT_CIN. For the lowest-order slice of each block, CIN0 is set to 0 and CIN1 is set to 1. For the lowest-order block, CIN is set to 0.

The CIN0 portion 510A and the CIN1 portion 510B are identical except that each takes in a different carry input to use. Each portion 510A-510B generates two values. One value is an input to the multiplexer 560, used to determine the higher sum bit. The other value, input to the multiplexer 570, is the conditional carry output that will be generated if the corresponding carry input (CIN0 or CIN1) is selected by CIN. Thus, the circuit 400 portion of all 2-bit adder slices can execute in parallel, since there is no dependency on the output of the adjacent slice. The CIN0 portion 510A and CIN1 portion 510B can execute in parallel as soon as the COUT0 and COUT1 signals are available from the next lower slice. The output portion waits for the CIN value for the adder block and the INT_COUT value generated by the previous adder slice to control the output multiplexers 560 and 570.

Figure 6:
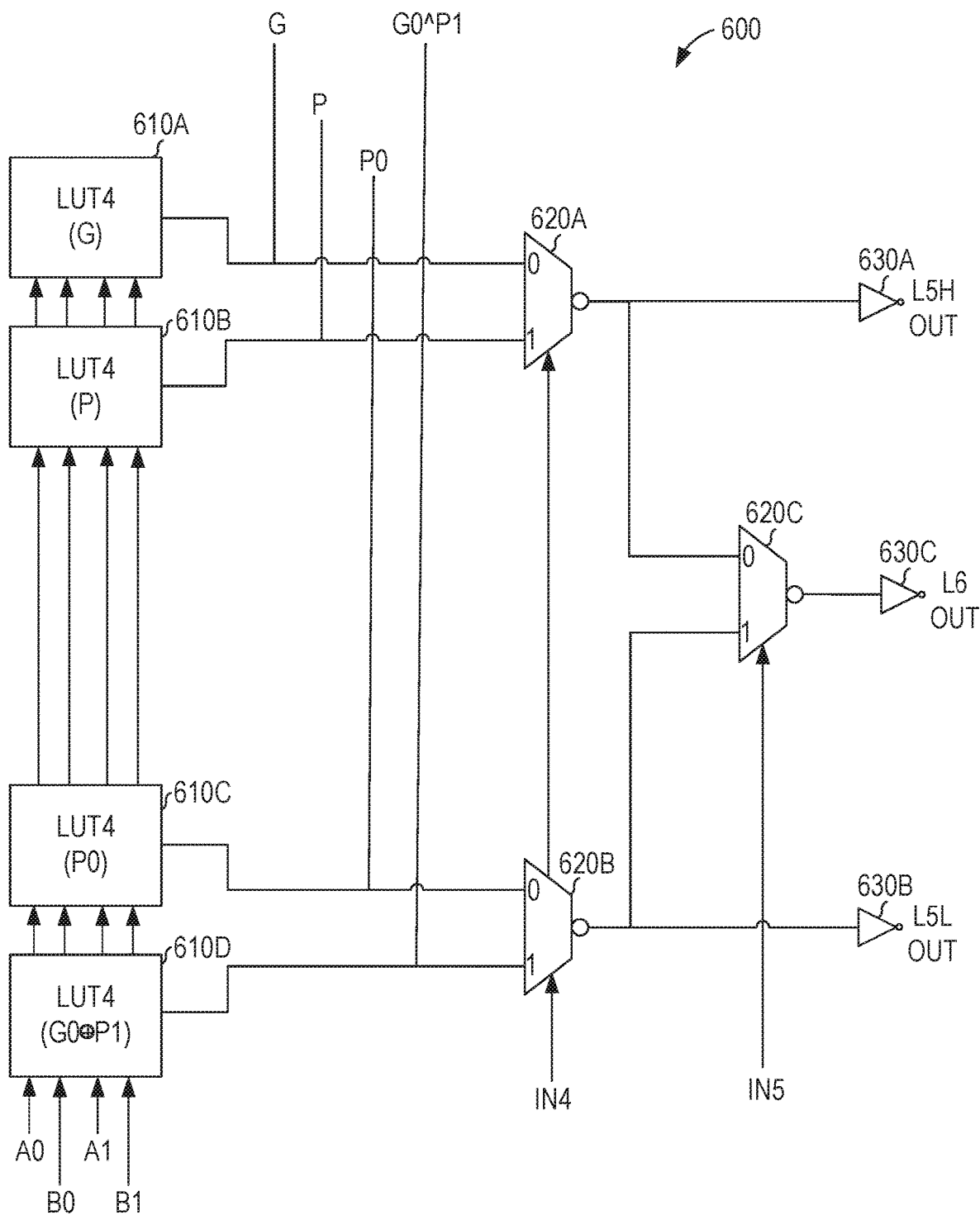
FIG. 6 is a diagrammatic view of a circuit that can operate as a 6-input LUT or as part of a 2-bit adder, according to various embodiments of the invention.

FIG. 6 is a diagrammatic view of a circuit 600 that can operate as a 6-input LUT or as part of a 2-bit adder, according to various embodiments of the invention. The circuit 600 comprises LUT4s 610A, 610B, 610C, and 610D; multiplexers 620A, 620B, and 620C; and NOT gates 630A, 630B, and 630C. The circuit 600 is the same as the circuit 400 except that the four LUT4s are configured to generate different results when operating as a 2-bit adder. Thus, when operating as a LUT6, the circuit 600 operates according to the description of the circuit 400 with respect to FIG. 4.

When operating as part of a 2-bit adder, the LUT4s 610A-610D are configured to implement four different functions, controlled by the two 2-bit operands. As shown in FIG. 6, two bits of A, A0 and A1, and two bits of B, B0 and B1, are used as the control signals for the four LUT4s 610A-610D.

The LUT4 610A implements the function G=G1G0. G0=A0B0 and G1=A1B1. Thus, G=A1B1A0B0.

The LUT4 610B implements the function P=P1P0. P0=A0⊕B0 and P1=A1⊕B1. Thus, P=(A0⊕B0)(A1⊕B1). The LUT4 610C implements the same function as the LUT4 410C, P0=A0⊕B0.

The LUT4 610D implements the function G0⊕P1. G0=A0B0 and P1=A1⊕B1. Thus, the LUT4 610D implements the function A0B0⊕(A1⊕B1).

Figure 7:
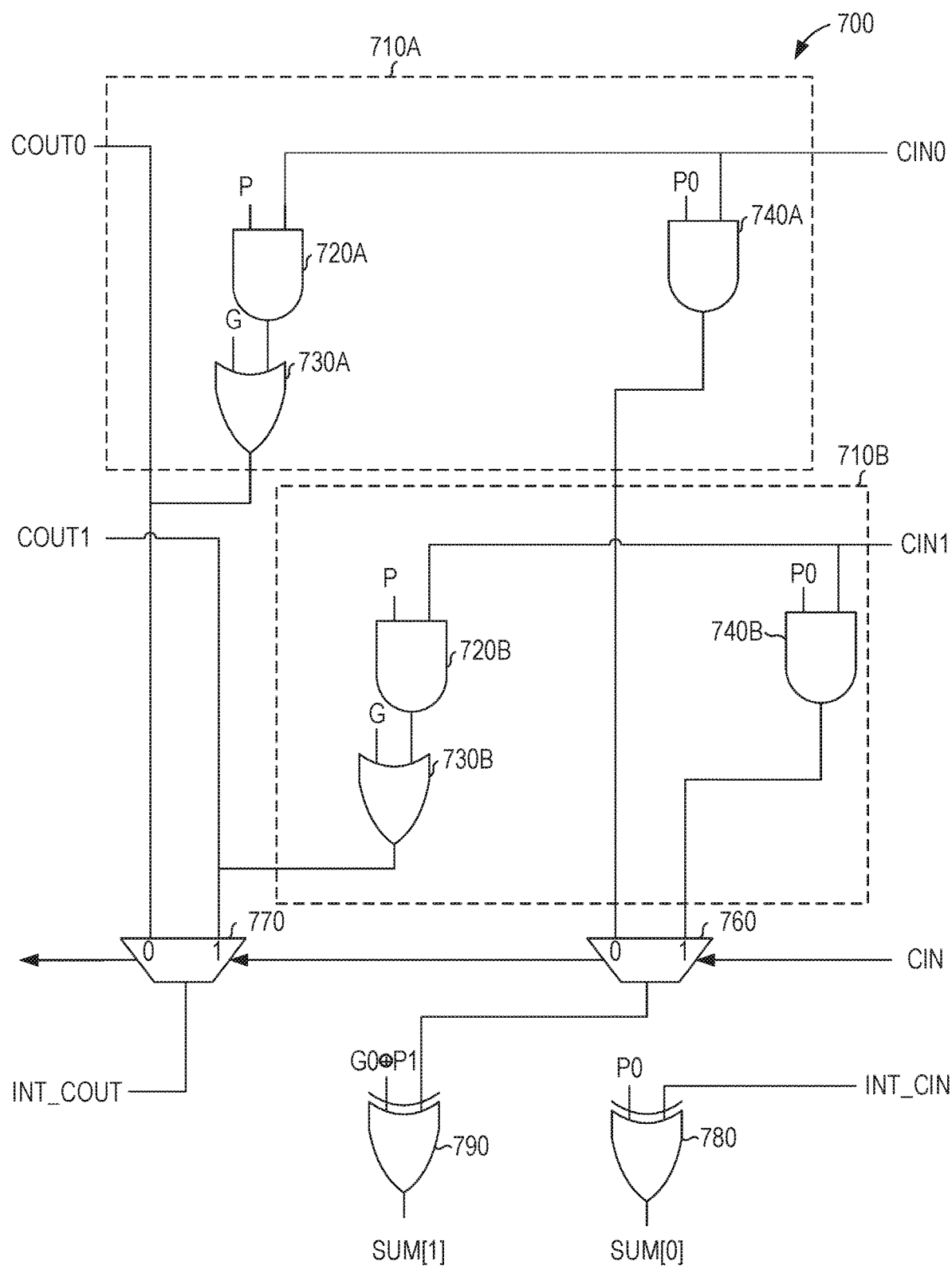
FIG. 7 is a diagrammatic view of a circuit that, in combination with the circuit of FIG. 6, operates as a 2-bit adder, according to various embodiments of the invention.

FIG. 7 is a diagrammatic view of a circuit 700 that, in combination with the circuit 600 of FIG. 6, operates as a 2-bit adder, according to various embodiments of the invention. The circuit 700 comprises a carry-in-zero (CIN0) portion 710A, a carry-in-one (CIN1) portion 710B, and an output portion that selects the output values based on the actual CIN value. The CIN0 portion 710A includes AND gates 720A and 740A and OR gate 730A. The CIN1 portion 710B includes AND gates 720B and 740B and OR gate 730B. An output portion of the circuit 700 comprises a multiplexer 760, a multiplexer 770, an XOR gate 780, and an XOR gate 790.

By comparison with the circuit 500, an OR gate has been removed from each of the portions 510A and 510B to create the portions 710A and 710B. Additionally, all of the AND gates in the circuit 700 are two-input OR gates, while the AND gates 520A and 520B of the circuit 500 are three-input OR gates. Thus, the circuit 700 uses fewer and simpler gates than the circuit 500 and occupies a smaller area on an FPGA.

The inputs to the circuit 700 are the four outputs from the LUT4s of the circuit 600 (P, P0, G, and G0⊕P1), the two carry-in values CIN0 and CIN1 from the previous slice, the carry-in value for the adder block CIN, and the carry-in value from the previous slice, INT_CIN. For the lowest-order slice, CIN0 is set to zero and CIN1 is set to one. Additionally, for the lowest-order block, CIN is set to zero.

The CIN0 portion 710A and the CIN1 portion 710B are identical except that each takes in a different carry input to use. Each portion 710A-710B generates two values. One value is an input to the multiplexer 760, used to determine the higher sum bit. The other value, input to the multiplexer 770, is the conditional carry output that will be generated if the corresponding carry input (CIN0 or CIN1) is selected by CIN. Thus, the circuit 600 portion of all 2-bit adder slices can execute in parallel, since there is no dependency on the output of the adjacent slice. The CIN0 portion 710A and CIN1 portion 710B can execute in parallel as soon as the COUT0 and COUT1 signals are available from the next lower slice. The output portion waits for the CIN value for the adder block and the INT_COUT value generated by the previous adder slice to control the output multiplexers 760 and 770.

By comparison with prior art dedicated 2-bit adder circuits, the two 2-bit adder circuits discussed above are more versatile, because they can also be used as four LUT4s, two LUT5s, or a LUT6. Additionally, the circuit of FIGS. 6-7 is more efficient than the circuit of FIGS. 4-5, providing the same functionality and versatility while using fewer gates.

Figure 8:
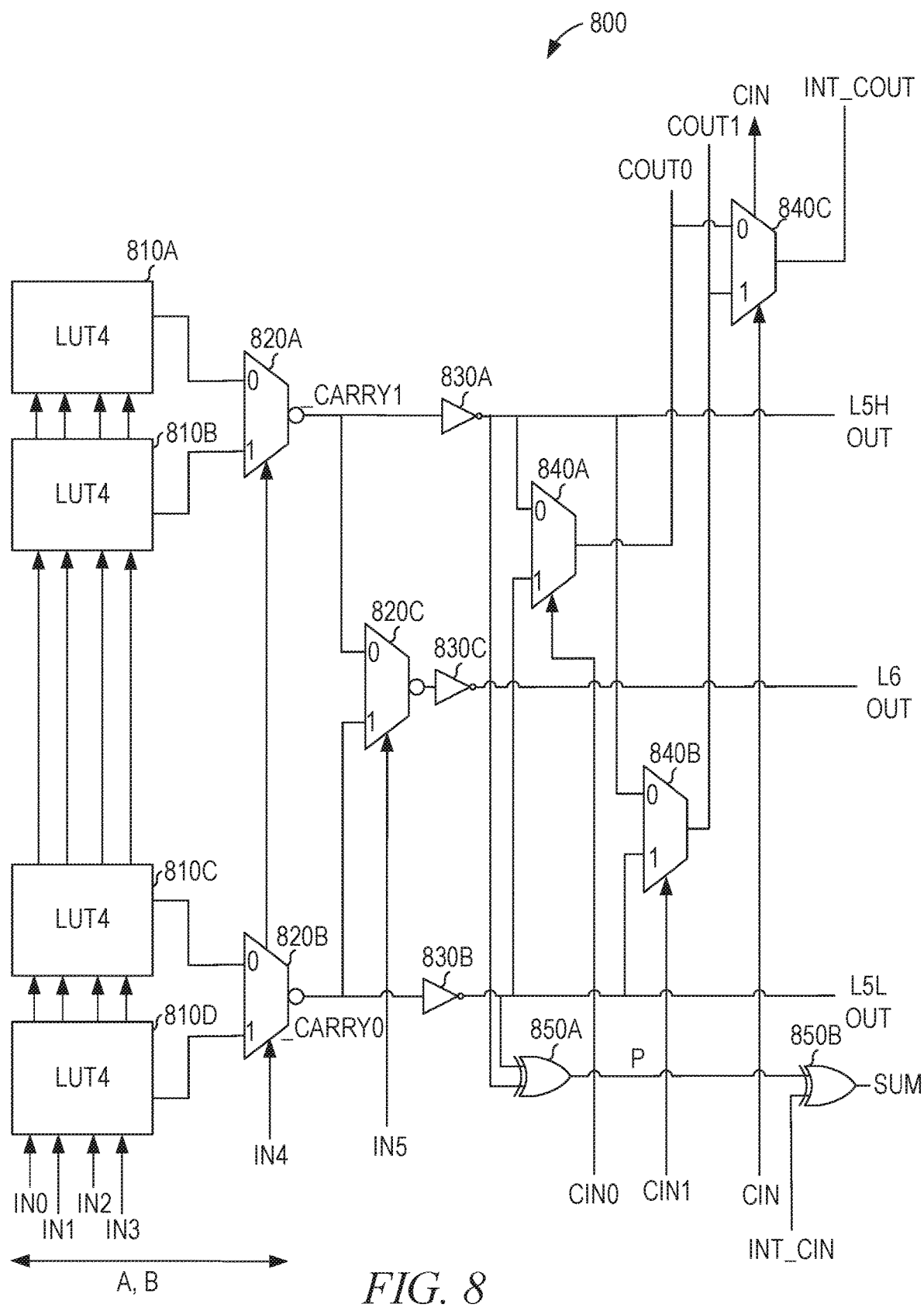
FIG. 8 is a diagrammatic view of a circuit that can operate as a 6-input LUT, as a 1-bit adder, or as another 1-bit cascading circuit, according to various embodiments of the invention.

FIG. 8 is a diagrammatic view of a circuit that can operate as a 6-input LUT, as a 1-bit adder, or as another 1-bit cascading circuit, according to various embodiments of the invention. The circuit 800 comprises LUT4s 810A, 810B, 810C, and 810D; multiplexers 820A, 820B, 820C, 840A, 840B, and 804C; NOT gates 830A, 830B, and 830C. When operating as a LUT6, the LUT4s 810A-810D and the multiplexers 820A-820C are controlled by the six inputs IN0-IN5 to control the selection of the output of the NOT gate 830C. Through configuration of the LUT4s 810A-810D, any LUT6 may be realized.

When operating as a 1-bit adder, the LUT4s 810A-810D are configured so that the _CARRY1 signal is generated as the output of the multiplexer 820A and the _CARRY0 signal is generated as the output of the multiplexer 820B. The _CARRY0 signal is an active-low signal that indicates whether the carry output will be set if the carry input is 0. Similarly, the _CARRY1 signal is an active-low signal that indicates whether the carry output will be set if the carry input is 1. Since the circuit 800 adds only one bit of each of the numbers being summed but the _CARRY0 and _CARRY1 signals are controlled by the five inputs IN0-IN4, additional flexibility in layout of an FPGA using the circuit 800 is realized.

The multiplexer 840A is controlled by the CIN0 signal to select between the _CARRY0 and _CARRY1 signals. The CIN0 signal indicates what the carry-in value from a lower-order 1-bit adder will be if the carry-in value to the block is 0. The multiplexer 840B is controlled by the CIN1 signal to select between the _CARRY0 and _CARRY1 signals. The CIN1 signal indicates what the carry-in value from a lower-order 1-bit adder will be if the carry-in value to the block is 1. Thus, the COUT0 and COUT1 values are determined before the CIN value from a lower-order block is received, allowing multiple blocks to work in parallel.

When the CIN value from the lower-order block is received, the CIN value is used by the multiplexer 840C to select between the COUT0 and COUT1 values to set INT_COUT. The CIN value is propagated to the next 1-bit slice.

The output of the NOT gate 850A is P, A⊕B. Once the INT_CIN value is received from the previous 1-bit slice, the output of the NOT gate 850B is the resulting sum bit. Within each block, the lowest-order slice will have CIN0 set to 0 and CIN1 set to 1. Additionally, for the lowest-order block, CIN is set to 0. For the remaining blocks, CIN is connected to the INT_COUT signal from the highest-order slice of the previous block.

Other functions using cascade connections may be implemented using the circuit 800. For example, a parity function that returns 1 if the number of 1 bits in a word is odd and 0 if the number of 1 bits even may be implemented using the circuit 800. In this example, each slice receives, using the inputs IN0-IN4, two or four bits of the word to be checked. The _CARRY0 and _CARRY1 values indicate the parity result if the output of the previous slice is 0 and 1, respectively. The end result of the parity check is the INT_COUT value of the last slice.

Another example of a one-input function that may be implemented using the circuit 800 is an OR function that returns 1 if any of the bits in a word is 1 and 0 if all of the bits in the word are 0. In this example, each slice receives, using the inputs IN0-IN4, two or four bits of the word to be checked. The _CARRY0 and _CARRY1 values indicate the OR result if the output of the previous slice is 0 and 1, respectively. The end result of the parity check is the INT_COUT value of the last slice.

Other examples of two-input functions that may be implemented using the circuit 800 are: An AND function that returns 1 if and only if any pair of corresponding bits in two inputs are both 1. An OR function that returns 1 if and only if any bit in either input is 1. A NAND function that returns 1 if and only if no pairs of corresponding bits in two inputs are both 1. A NOR function that returns 1 if and only if every bit in both inputs is 0. An XOR function that returns 1 if and only if any pair of corresponding bits in two inputs are different. An NXOR function that returns 1 if and only if the two inputs are identical. In each case, the _CARRY0 and _CARRY1 values indicate the result if the output of the previous slice is 0 and 1, respectively. The end result of the function is the INT_COUT value of the last slice.

Though the circuits are generally described herein as being active-high, such that a high voltage indicates a logical 1 or Boolean true value, alternative embodiments that are active-low, such that a low voltage indicates a logical 1 or Boolean true value are contemplated. Thus, an "active" signal may be high or low voltage, depending on the circuit design.

The same physical circuit may be configured to operate in different modes of operation by configuring the LUT4s of the circuit 800. For example, in a first mode of operation, the carry-select adder of FIG. 8 may be implemented while, in a second mode of operation, any of the functions described above may be implemented.

By comparison with prior art dedicated 1-bit adder circuits, the 1-bit adder circuit of FIG. 8 is more versatile because it can also be used as four LUT4s, two LUT5s, or a LUT6. Additionally, the circuit of FIG. 8 adds less overhead to a standard LUT6 compared to the circuit of FIGS. 6-7. The circuit of FIG. 8 is also more flexible than the circuit of FIGS. 6-7, increasing flexibility in routing and being configurable to implement cascading functions beyond addition and subtraction.

Figure 9:
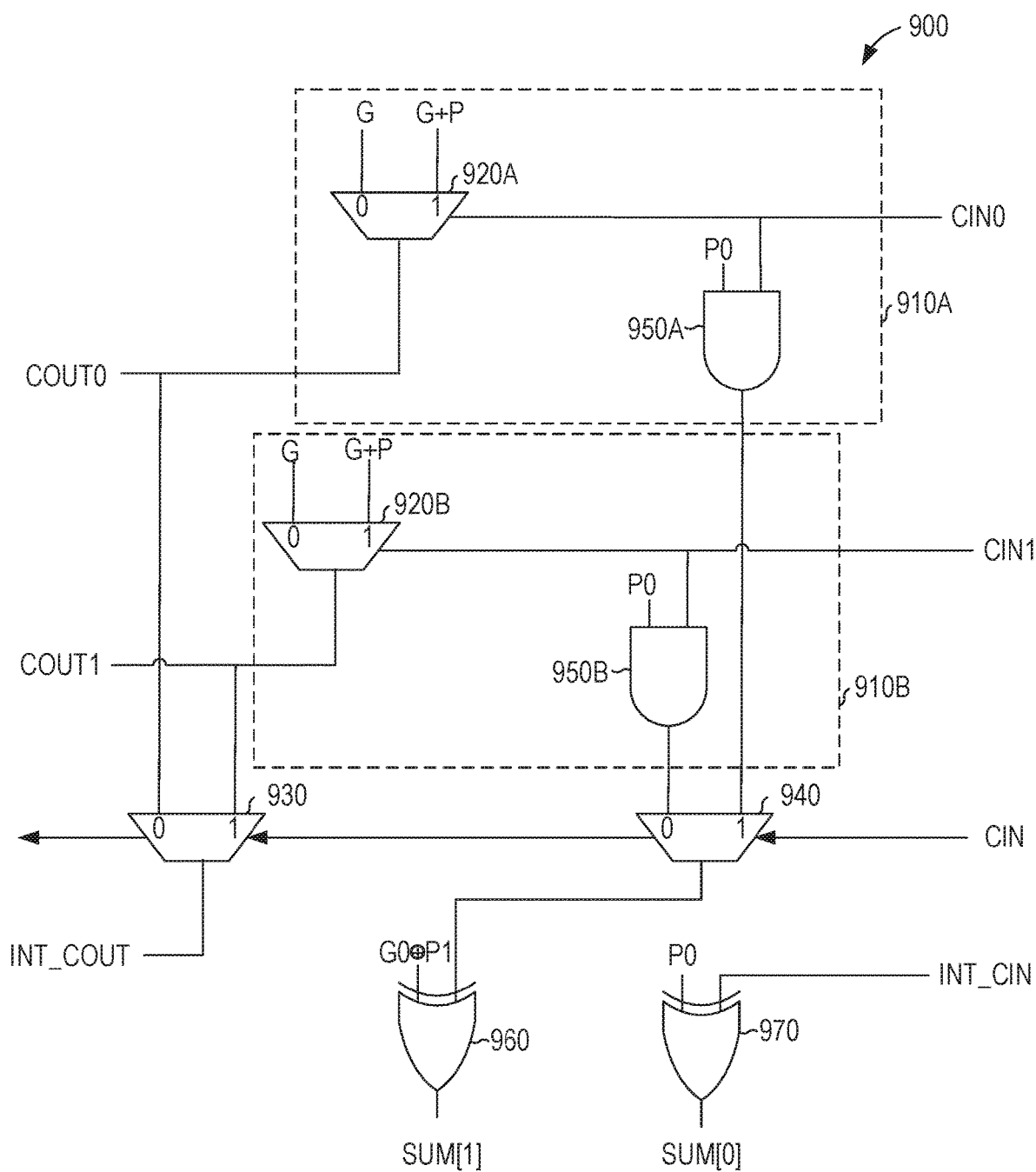
FIG. 9 is a diagrammatic view of a circuit that, in combination with a modified version the circuit of FIG. 4, operates as a 2-bit adder, according to various embodiments of the invention.

FIG. 9 is a diagrammatic view of a circuit 900 that, in combination with a modified version of the circuit of FIG. 4, operates as a 2-bit adder, according to various embodiments of the invention. The circuit 900 comprises a carry-in-zero (CIN0) portion 910A, a carry-in-one (CIN1) portion 910B, and an output portion that selects the output values based on the actual CIN value. The CIN0 portion 910A includes a multiplexer 920A and an AND gate 950A. The CIN1 portion 910B includes a multiplexer 920B and an AND gate 950B. An output portion of the circuit 900 comprises a multiplexer 930, a multiplexer 940, an XOR gate 960, and an XOR gate 970.

The inputs to the circuit 900 are the four outputs from the LUT4s of the circuit 400, modified to contain the values G, G+P, P0, and G0^P1, the two carry-in values CIN0 and CIN1 from the previous slice, the carry-in value for the adder block CIN, and the carry-in value from the previous slice, INT_CIN. For the lowest-order slice of each block, CIN0 is set to 0 and CIN1 is set to 1. For the lowest-order block, CIN is set to 0.

The CIN0 portion 910A and the CIN1 portion 910B are identical except that each takes in a different carry input to use. Each portion 910A-910B generates two values. One value is an input to the multiplexer 940, used to determine the higher sum bit. The other value, input to the multiplexer 930, is the conditional carry output that will be generated if the corresponding carry input (CIN0 or CIN1) is selected by CIN. Thus, the modified circuit 400 portion of all 2-bit adder slices can execute in parallel, since there is no dependency on the output of the adjacent slice. The CIN0 portion 910A and CIN1 portion 910B can execute in parallel as soon as the COUT0 and COUT1 signals are available from the next lower slice. The output portion waits for the CIN value for the adder block and the INT_COUT value generated by the previous adder slice to control the output multiplexers 940 and 930.

By modifying the contents of the LUT4s of the circuit 400, other cascading functions may be performed by ALU slices formed using the circuit 900. For example, AND, OR, NAND, NOR, XOR, or NXOR functions may be performed. In each case, the COUT0 and COUT 1 values indicate the result if the output of the previous slice is 0 and 1, respectively. The end result of the function is the INT_COUT value of the last slice.

Figure 10:
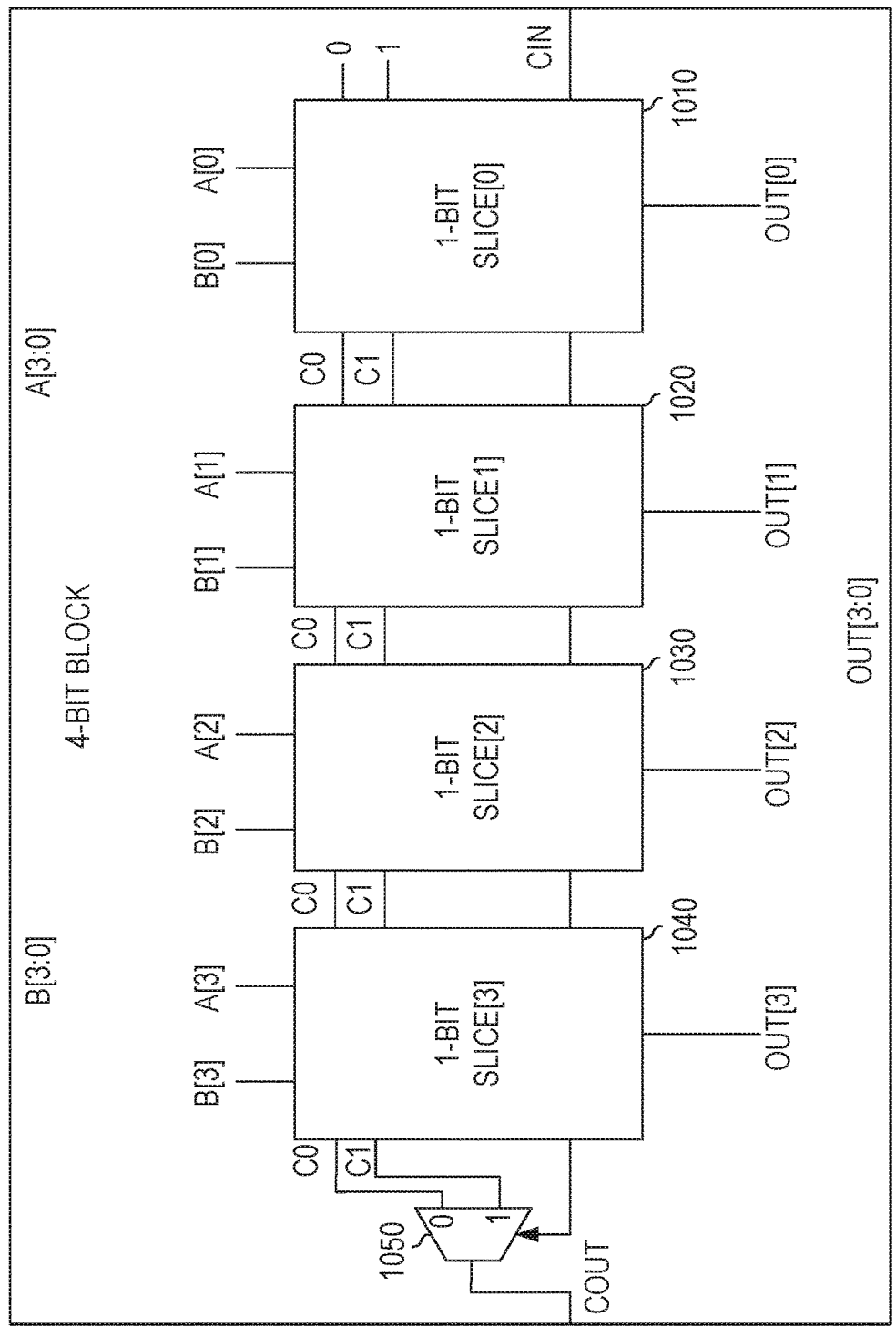
FIG. 10 is a diagrammatic view of a 4-bit adder using 1-bit adder slices, according to various embodiments of the invention.

FIG. 10 is a diagrammatic view of a 4-bit adder block 1000 using 1-bit adder slices, according to various embodiments of the invention. The 4-bit adder block 1000 receives as input two four-bit operands (A[3:0] and B[3:0]) to be added, and a carry input from a lower-order adder block. The 4-bit adder block 1000 generates as output a four-bit sum (OUT[3:0]) and a carry output to a higher-order adder block. The 4-bit adder block 1000 includes 1-bit adder slices 1010, 1020, 1030, and 1040 and a multiplexer 1050. In some examples, each of the 1-bit adder slices 1010-1040 is implemented using the circuit 300 or the circuit 800.

Each of the 1-bit adder slices 1010-1040 receives one bit of each operand, the CIN0 and CIN1 values, and the carry input for the block. The lowest-order slice 1010 receives constant 0 and 1 values for CIN0 and CIN1, respectively, since the carry input for the lowest-order slice will simply be CIN. The two carry output values (shown as C0 and C1 in FIG. 10) from the slice 1010 will depend on the operand values. For example, if A[0] and B[0] are both zero, there will not be a carry out regardless of the carry in, so both C0 and C1 will be zero. If exactly one of A[0] and B[0] is one, C0 will be zero and C1 will be one. The C0 and C1 signals are generated by each of the slices 1010-1030 and provided as input to the slices 1020-1040, as shown. When the CIN signal becomes available to the 4-bit adder block 1000, each slice selects between the two possible output values (e.g., using the multiplexer 310Q of FIG. 3) and the four output bits are generated.

Additionally, the 4-bit adder block 1000 generates a carry out value. The multiplexer 1050 selects between the two possible carry out values generated by the high-order slice 1040, using the CIN signal as a control signal.

In some example embodiments, alternate slices use different circuit designs. For example, if the design of the circuit for each slice inverts the C0 and C1 output signals, every second slice will reverse the inputs to the multiplexer controlled by the CIN signal. Circuit designs (such as the circuit 800) that do not invert the C0 and C1 signals may be simpler to use by virtue of avoiding the complexity of different circuits for different slices of an adder block.

FIG. 10 shows an example of an 4-bit adder block built using four 1-bit adder slices, but larger (or smaller) blocks can be created by using more (or fewer) 1-bit adder slices.

Figure 11:
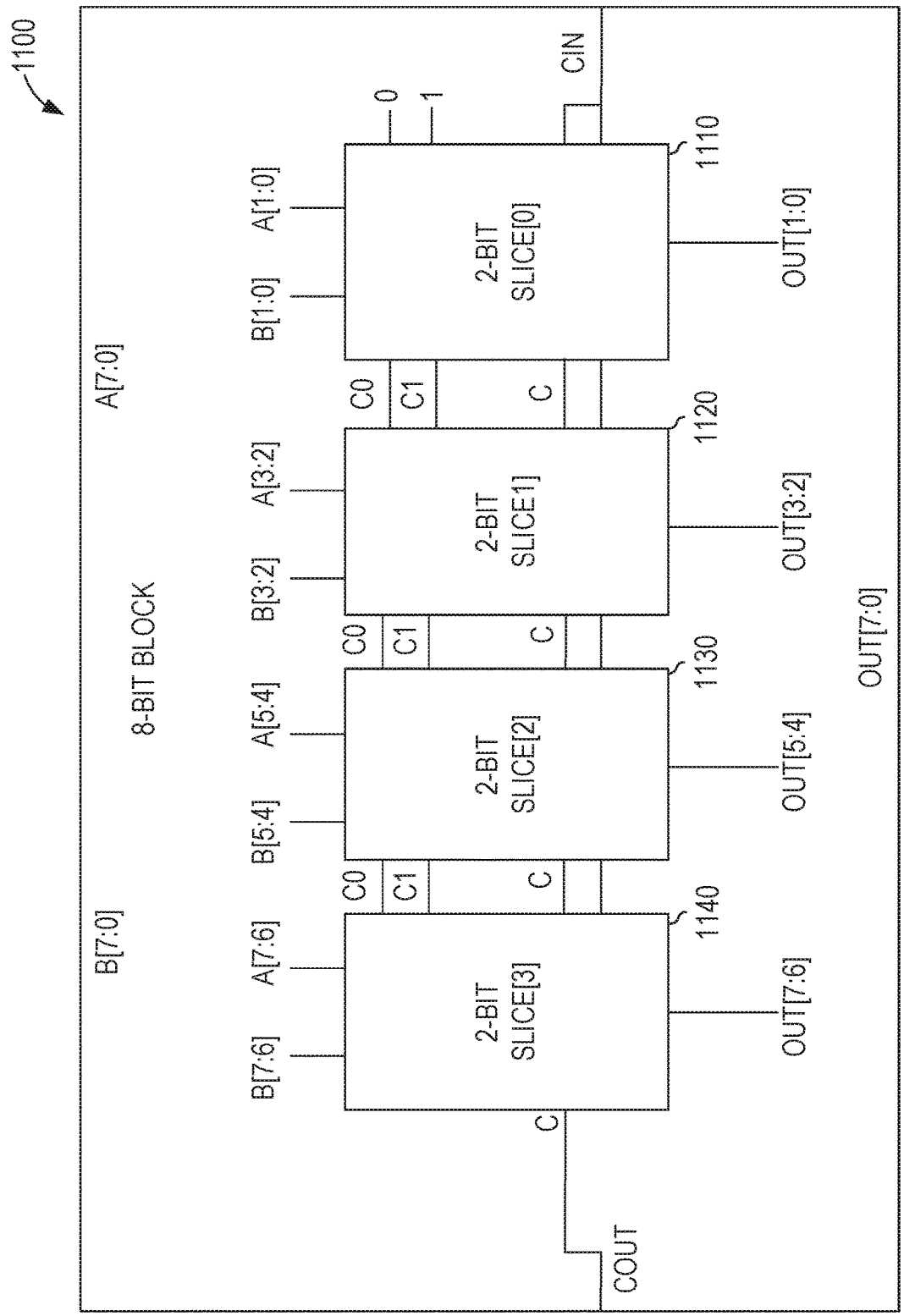
FIG. 11 is a diagrammatic view of an 8-bit adder using 2-bit adder slices, according to various embodiments of the invention.

FIG. 11 is a diagrammatic view of an 8-bit adder block 1100 built using 2-bit adder slices, according to various embodiments of the invention. The 8-bit adder block 1100 comprises 2-bit adder slices 1110, 1120, 1130, and 1140. The 8-bit adder block 1100 receives two 8-bit operands (A[7:0] and B[7:0]) to be added and a carry input from a lower-order adder block (set to zero if this is the lowest-order adder block). The 8-bit adder block 1100 generates as output an 8-bit sum (OUT[7:0]) and a carry output (COUT). The carry output for the 8-bit adder block 1100 is the carry output from the highest-order 2-bit adder slice 1140.

Each of the 2-bit adder slices 1110-1140 receives as input two bits of each of the operands, the carry input from the lower-order adder block, the conditional carry inputs from the next lower 2-bit adder slice (labeled C0 and C1 in FIG. 11), and the actual carry input from the next lower 2-bit adder slice (labeled C in FIG. 11). In some examples, each of the 2-bit adder slices 1110-1140 is implemented using circuits 400 and 500, circuits 400 and 900, or circuits 600 and 700.

As can be seen in FIG. 11, the lowest-order 2-bit slice 1110 uses CIN as both the carry input value from the lower-order block and the carry input value from the lower-order slice. Similarly, the C0 and C1 inputs are defined as being 0 and 1, respectively, since the carry input value for the 2-bit slice 1110 will be equal to the value of CIN.

FIG. 11 shows an example of an 8-bit adder block built using four 2-bit adder slices, but larger (or smaller) blocks can be created by using more (or fewer) 2-bit adder slices.

Figure 12:
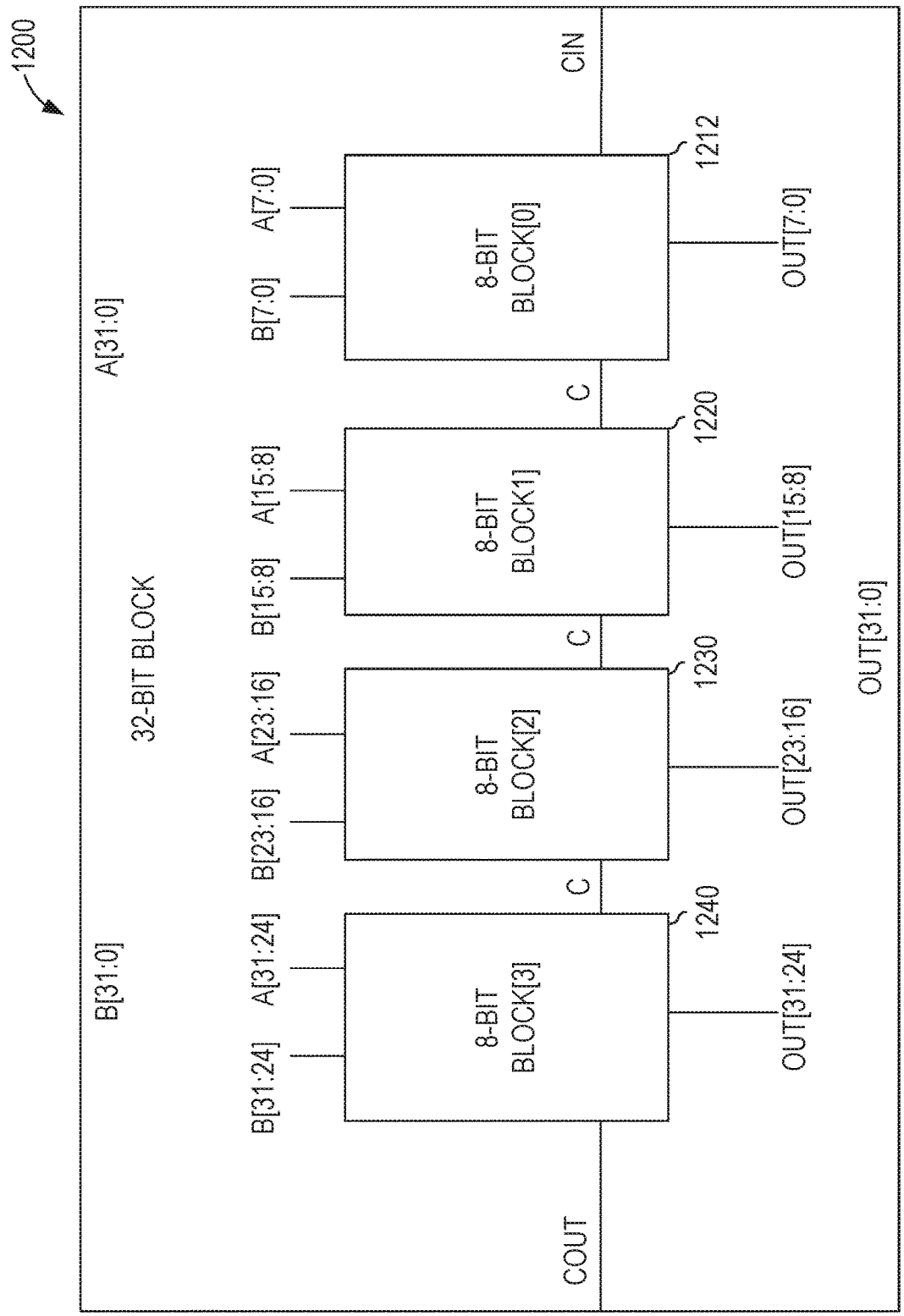
FIG. 12 is a diagrammatic view of a 32-bit adder using 8-bit adder blocks, according to various embodiments of the invention.

FIG. 12 is a diagrammatic view of a 32-bit adder block 1200 using four 8-bit adder blocks 1210, 1220, 1230, and 1240, according to various embodiments of the invention. In some examples, each of the four 8-bit adder blocks 1210-1240 is implemented using the 8-bit adder block 1100. The 32-bit adder block takes, as input, two 32-bit operands (A[31:0] and B[31:0]) and a carry input (CIN) from a lower-order adder block. CIN is set to zero if there is no lower-order adder block.

Each of the four 8-bit adder blocks 1210-1240 takes, as input, eight bits of each operand and the carry input of the lower-order block. For the lowest-order 8-bit adder block 1210, the carry input of the lower-order block is CIN, the carry input to the 32-bit adder block 1200.

Larger (or smaller) adder blocks can be created by using more (or fewer) 8-bit adder blocks. Additionally, larger adder blocks can be formed by using multiple 32-bit adder blocks 1200.

In the foregoing specification, some example implementations of the disclosure have been described. The specification and drawings are, accordingly, to be regarded in an illustrative sense rather than in a restrictive sense. Below is a non-exhaustive list of examples of implementations of the present disclosure.

Example 1 is a circuit comprising: a first two-bit arithmetic logic unit (ALU) slice configured to: receive as input two bits of a first operand, two bits of a second operand, and a carry-in bit from a second two-bit ALU slice; and provide as output two sum bits and a carry-out bit, the two sum bits containing the sum of the input two bits of the first operand and the input two bits of the second operand; the first two-bit ALU slice comprising: a plurality of four-input lookup tables (LUT4s), each of the plurality of LUT4s receiving the two bits of the first operand and the two bits of the second operand as inputs.

In Example 2, the subject matter of Example 1 includes, the plurality of LUT4s is four LUT4s.

In Example 3, the subject matter of Examples 1-2 includes, a first LUT4 of the plurality of LUT4s is configured to generate an output that is a binary exclusive or (XOR) of a low bit of the first operand with a low bit of the second operand.

In Example 4, the subject matter of Example 3 includes, a second LUT4 of the plurality of LUT4s is configured to generate an output that is an XOR of a high bit of the first operand with a high bit of the second operand.

In Example 5, the subject matter of Example 4 includes, a third LUT4 of the plurality of LUT4s is configured to generate an output that is an AND of the low bit of the first operand with the low bit of the second operand.

In Example 6, the subject matter of Example 5 includes, a fourth LUT4 of the plurality of LUT4s is configured to generate an output that is an OR of: an AND of the high bit of the first operand with the high bit of the second operand; and an AND of: the XOR of the high bit of the first operand with the high bit of the second operand; and the AND of the low bit of the first operand with the low bit of the second operand.

In Example 7, the subject matter of Examples 3-6 includes, a second LUT4 of the plurality of LUT4s is configured to generate an output that is a binary and (AND) of: the binary XOR of the low bit of the first operand with the low bit of the second operand; and an XOR of a high bit of the first operand with a high bit of the second operand.

In Example 8, the subject matter of Example 7 includes, a third LUT4 of the plurality of LUT4s is configured to generate an output that is an exclusive or (XOR) of: an AND of the low bit of the first operand with the low bit of the second operand; and the XOR of the high bit of the first operand with the high bit of the second operand.

In Example 9, the subject matter of Example 8 includes, a fourth LUT4 of the plurality of LUT4s is configured to generate an output that is an OR of: an AND of the high bit of the first operand with the high bit of the second operand; and an AND of: the XOR of the high bit of the first operand with the high bit of the second operand; and the AND of the low bit of the first operand with the low bit of the second operand.

In Example 10, the subject matter of Examples 3-9 includes, a low order bit of the sum bits is an XOR of the output of the first LUT4 with the carry-in bit.

In Example 11, the subject matter of Examples 1-10 includes, wherein the first two-bit ALU slice is further configured to receive: a first input bit from the second two-bit ALU slice, the first input bit representing the carry output of the second two-bit ALU slice if a carry input to the second two-bit ALU slice is zero; and a second input bit from the second two-bit ALU slice, the second input bit representing the carry output of the second two-bit ALU slice if the carry input to the second two-bit ALU slice is one.

In Example 12, the subject matter of Example 11 includes, wherein the first input bit and the second input bit are received by the first two-bit ALU slice before the second two-bit ALU slice receives the carry input to the second two-bit ALU slice.

Example 13 is a machine-readable storage medium containing instructions that when executed by a machine, cause the machine to program a field programmable gate array (FPGA) to generate a circuit comprising: a first two-bit arithmetic logic unit (ALU) slice configured to: receive as input two bits of a first operand, two bits of a second operand, and a carry-in bit from a second two-bit ALU slice; and provide as output two sum bits and a carry-out bit, the two sum bits containing the sum of the input two bits of the first operand and the input two bits of the second operand; the first two-bit ALU slice comprising: a plurality of four-input lookup tables (LUT4s), each of the plurality of LUT4s receiving the two bits of the first operand and the two bits of the second operand as inputs.

In Example 14, the subject matter of Example 13 includes, wherein the plurality of LUT4s is four LUT4s.

In Example 15, the subject matter of Examples 13-14 includes, wherein a first LUT4 of the plurality of LUT4s is configured to generate an output that is a binary exclusive or (XOR) of a low bit of the first operand with a low bit of the second operand.

In Example 16, the subject matter of Example 15 includes, wherein a second LUT4 of the plurality of LUT4s is configured to generate an output that is an XOR of a high bit of the first operand with a high bit of the second operand.

In Example 17, the subject matter of Example 16 includes, wherein a third LUT4 of the plurality of LUT4s is configured to generate an output that is an AND of the low bit of the first operand with the low bit of the second operand.

Example 18 is a system comprising: a memory that stores instructions; and one or more processors configured by the instructions to perform operations comprising: programming a field programmable gate array (FPGA) to generate a circuit comprising: a first two-bit arithmetic logic unit (ALU) slice configured to: receive as input two bits of a first operand, two bits of a second operand, and a carry-in bit from a second two-bit ALU slice; and provide as output two sum bits and a carry-out bit, the two sum bits containing the sum of the input two bits of the first operand and the input two bits of the second operand; the first two-bit ALU slice comprising: a plurality of four-input lookup tables (LUT4s), each of the plurality of LUT4s receiving the two bits of the first operand and the two bits of the second operand as inputs.

In Example 19, the subject matter of Example 18 includes, wherein the plurality of LUT4s is four LUT4s.

In Example 20, the subject matter of Examples 18-19 includes, wherein a first LUT4 of the plurality of LUT4s is configured to generate an output that is a binary exclusive or (XOR) of a low bit of the first operand with a low bit of the second operand.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A circuit comprising:
   a first two-bit arithmetic logic unit (ALU) slice comprising:
      a plurality of four-input lookup tables (LUT4s) including a first LUT4 and a second LUT4;
      input connections configured to receive as input two bits of a first operand, two bits of a second operand, a first carry-in bit from a second two-bit ALU slice, and a second carry-in bit from a third two-bit ALU slice;
      a multiplexer controlled by the second carry-in bit; and
      output connections configured to provide, as output, two sum bits and a carry-out bit, the two sum bits containing the sum of the input two bits of the first operand, the input two bits of the second operand, and the first carry-in bit;
   wherein:
      each of the plurality of LUT4s receives the two bits of the first operand and the two bits of the second operand as inputs;
      the first LUT4 is configured to generate an output that is a binary exclusive or (XOR) of a low bit of the first operand with a low bit of the second operand; and
      a high order bit of the sum bits is an XOR of the output of the second LUT4 of the plurality of LUT4s with the output of the multiplexer.

2. The circuit of claim 1, wherein the plurality of LUT4s is four LUT4s.

3. The circuit of claim 2, wherein the four LUT4s are implemented as components of two LUT5s.

4. The circuit of claim 2, wherein the four LUT4s are implemented as components of a LUT6.

5. The circuit of claim 1, wherein the second LUT4 of the plurality of LUT4s is configured to generate an output that is an XOR of a high bit of the first operand with a high bit of the second operand.

6. The circuit of claim 5, wherein a third LUT4 of the plurality of LUT4s is configured to generate an output that is an AND of the low bit of the first operand with the low bit of the second operand.

7. The circuit of claim 6, wherein a fourth LUT4 of the plurality of LUT4s is configured to generate an output that is an OR of:
   an AND of the high bit of the first operand with the high bit of the second operand; and
   an AND of:
      the XOR of the high bit of the first operand with the high bit of the second operand; and
      the AND of the low bit of the first operand with the low bit of the second operand.

8. The circuit of claim 1, wherein the second LUT4 of the plurality of LUT4s is configured to generate an output that is an AND of:
   the binary XOR of the low bit of the first operand with the low bit of the second operand; and
   an XOR of a high bit of the first operand with a high bit of the second operand.

9. The circuit of claim 8, wherein a third LUT4 of the plurality of LUT4s is configured to generate an output that is an exclusive or (XOR) of:
   an AND of the low bit of the first operand with the low bit of the second operand; and
   the XOR of the high bit of the first operand with the high bit of the second operand.

10. The circuit of claim 9, wherein a fourth LUT4 of the plurality of LUT4s is configured to generate an output that is an OR of:
    an AND of the high bit of the first operand with the high bit of the second operand; and
    an AND of:
       the XOR of the high bit of the first operand with the high bit of the second operand; and
       the AND of the low bit of the first operand with the low bit of the second operand.

11. The circuit of claim 1, wherein a low order bit of the sum bits is an XOR of the output of the first LUT4 with the first carry-in bit.

12. The circuit of claim 1, wherein the input connections of the first two-bit ALU slice are further configured to receive:
    a first input bit from the second two-bit ALU slice, the first input bit representing the carry-out bit of the second two-bit ALU slice if a carry input to the second two-bit ALU slice is zero; and
    a second input bit from the second two-bit ALU slice, the second input bit representing the carry-out bit of the second two-bit ALU slice if the carry input to the second two-bit ALU slice is one.

13. The circuit of claim 12, wherein the first input bit and the second input bit are received by the first two-bit ALU slice before the second two-bit ALU slice receives the carry input to the second two-bit ALU slice.

14. The circuit of claim 1, wherein:
    the first two-bit ALU slice is configured to provide, as the output, the two sum bits and the carry-out bit, in a first mode of operations; and in a second mode of operation, the first two-bit ALU slice is configured to:
provide, as output, a first output bit based on the input two bits of the first operand, the input two bits of the second operand, and an assumed value of zero for the first carry-in bit, the first output bit being provided before the first carry-in bit is received as input;
provide, as output, a second output bit based on the input two bits of the first operand, the input two bits of the second operand, and an assumed value of one for the first carry-in bit, the second output bit being provided before the first carry-in bit is received as input.

15. The circuit of claim 14, comprising one or more additional ALU slices including a highest-order ALU slice, such that the circuit generates, as an output of the highest-order ALU slice in the second mode of operation, one of the following values:
a one-bit value that is active if and only if any pair of corresponding bits in the first operand the second operand are active;
a one-bit value that is active if and only if any bit in the first operand or the second operand is active;
a one-bit value that is active if and only if no pairs of corresponding bits in the first operand and the second operand are both active;
a one-bit value that is active if and only if every bit in the first operand and the second operand is not active;
a one-bit value that is active if and only if any pair of corresponding bits in the first operand and the second operand are different; or
a one-bit value that is active if and only if the first operand and the second operand are identical.

16. A computer-readable medium containing instructions that when executed by a machine, cause the machine to program a field programmable gate array (FPGA) to generate a circuit comprising:
a first two-bit arithmetic logic unit (ALU) slice comprising:
a plurality of four-input lookup tables (LUT4s) including a first LUT4 and a second LUT4;
input connections configured to receive as input two bits of a first operand, two bits of a second operand, a first carry-in bit from a second two-bit ALU slice, and a second carry-in bit from a third two-bit ALU slice;
a multiplexer controlled by the second carry-in bit; and
output connections configured to provide, as output, two sum bits and a carry-out bit, the two sum bits containing the sum of the input two bits of the first operand, the input two bits of the second operand, and the first carry-in bit;
wherein:
each of the plurality of LUT4s receives the two bits of the first operand and the two bits of the second operand as inputs;
the first LUT4 is configured to generate an output that is a binary exclusive or (XOR) of a low bit of the first operand with a low bit of the second operand; and
a high order bit of the sum bits is an XOR of the output of the second LUT4 of the plurality of LUT4s with the output of the multiplexer.

17. The computer-readable medium of claim 16, wherein the plurality of LUT4s is four LUT4s.

18. The computer-readable medium of claim 16, wherein:
the first two-bit ALU slice is configured to provide, as the output, the two sum bits and the carry-out bit, in a first mode of operations; and
in a second mode of operation, the first two-bit ALU slice is configured to:
provide, as output, a first output bit based on the input two bits of the first operand, the input two bits of the second operand, and an assumed value of zero for the first carry-in bit, the first output bit being provided before the first carry-in bit is received as input;
provide, as output, a second output bit based on the input two bits of the first operand, the input two bits of the second operand, and an assumed value of one for the first carry-in bit, the second output bit being provided before the first carry-in bit is received as input.

19. The computer-readable medium of claim 18, wherein the circuit further comprises one or more additional ALU slices including a highest-order ALU slice, such that the circuit generates, as an output of the highest-order ALU slice in the second mode of operation, one of the following values:
a one-bit value that is active if and only if any pair of corresponding bits in the first operand the second operand are active;
a one-bit value that is active if and only if any bit in the first operand or the second operand is active;
a one-bit value that is active if and only if no pairs of corresponding bits in the first operand and the second operand are both active;
a one-bit value that is active if and only if every bit in the first operand and the second operand is not active;
a one-bit value that is active if and only if any pair of corresponding bits in the first operand and the second operand are different; or
a one-bit value that is active if and only if the first operand and the second operand are identical.

20. A system comprising:
a memory that stores instructions; and
one or more processors configured by the instructions to perform operations comprising:
programming a field programmable gate array (FPGA) to generate a circuit comprising:
a first two-bit arithmetic logic unit (ALU) slice comprising:
a plurality of four-input lookup tables (LUT4s) including a first LUT4 and a second LUT4;
input connections configured to receive as input two bits of a first operand, two bits of a second operand, a carry-in bit from a second two-bit ALU slice, and a second carry-in bit from a third two-bit ALU slice;
a multiplexer controlled by the second carry-in bit; and
output connections configured to provide, as output, two sum bits and a carry-out bit, the two sum bits containing the sum of the input two bits of the first operand, the input two bits of the second operand, and the first carry-in bit;
wherein:
each of the plurality of LUT4s receives the two bits of the first operand and the two bits of the second operand as inputs;

the first LUT4 is configured to generate an output that is a binary exclusive or (XOR) of a low bit of the first operand with a low bit of the second operand; and a high order bit of the sum bits is an XOR of the output of the second LUT4 of the plurality of LUT4s with the output of the multiplexer.

\* \* \* \* \*